(12) United States Patent
Mele et al.

(10) Patent No.: US 9,778,377 B2
(45) Date of Patent: Oct. 3, 2017

(54) METHOD OF PERFORMING SPECTROSCOPY IN A TRANSMISSION CHARGED-PARTICLE MICROSCOPE

(71) Applicant: FEI Company, Hillsboro, OR (US)

(72) Inventors: Luigi Mele, Eindhoven (NL); Albertus Aemillius Seyno Sluijterman, Eindhoven (NL); Gerard Nicolaas Anne van Veen, Waalre (NL)

(73) Assignee: FEI Company, Hillsboro, OR (US)

( * ) Notice: Subject to any disclaimer, the term of this patent is extended or adjusted under 35 U.S.C. 154(b) by 0 days.

(21) Appl. No.: 15/072,929

(22) Filed: Mar. 17, 2016

(65) Prior Publication Data

US 2016/0276130 A1   Sep. 22, 2016

(30) Foreign Application Priority Data

Mar. 18, 2015 (EP) .................................. 15159576

(51) Int. Cl.
*H01J 37/244* (2006.01)
*H01J 37/28* (2006.01)
(Continued)

(52) U.S. Cl.
CPC .......... *G01T 1/2006* (2013.01); *H01J 37/244* (2013.01); *H01J 37/28* (2013.01);
(Continued)

(58) Field of Classification Search
CPC .......... H01J 37/26; H01J 37/28; H01J 37/044; H01J 37/22; H01J 37/05; H01J 37/263;
(Continued)

(56) References Cited

U.S. PATENT DOCUMENTS

| 4,812,652 | A * | 3/1989 | Egle | .................... | H01J 37/26 |
| | | | | | 250/305 |
| 6,703,613 | B2 * | 3/2004 | Kaji | .................... | G01N 23/2251 |
| | | | | | 250/305 |

(Continued)

FOREIGN PATENT DOCUMENTS

| EP | 2423943 | 2/2012 |
| EP | 2423943 A1 | 2/2012 |

(Continued)

OTHER PUBLICATIONS

Egerton, R., "Energy-Loss Spectroscopy in the Electron Microscope", third edition, 2011, ISBN 978-1-4419-9583-4, Springer Science & Business Media; 37 pages.

(Continued)

*Primary Examiner* — David A Vanore
(74) *Attorney, Agent, or Firm* — Scheinberg & Associates, P.C.; Michael O. Scheinberg

(57) ABSTRACT

A Transmission Charged-Particle Microscope comprises a source of charged particles which are then directed by an illuminator onto a specimen supported by a specimen holder. Charged particles transmitted through the specimen may undergo energy loss with a distribution of losses providing information about the specimen. A dispersing device disperses the transmitted charged particles into an energy-resolved array of spectral sub-beams distributed along a dispersion direction. The dispersed charged particles are detected by a detector comprising an assembly of sub-detectors arranged along said dispersion direction, whereby different sub-detectors are adjustable to have different detection sensitivities.

20 Claims, 3 Drawing Sheets

Figure 1:
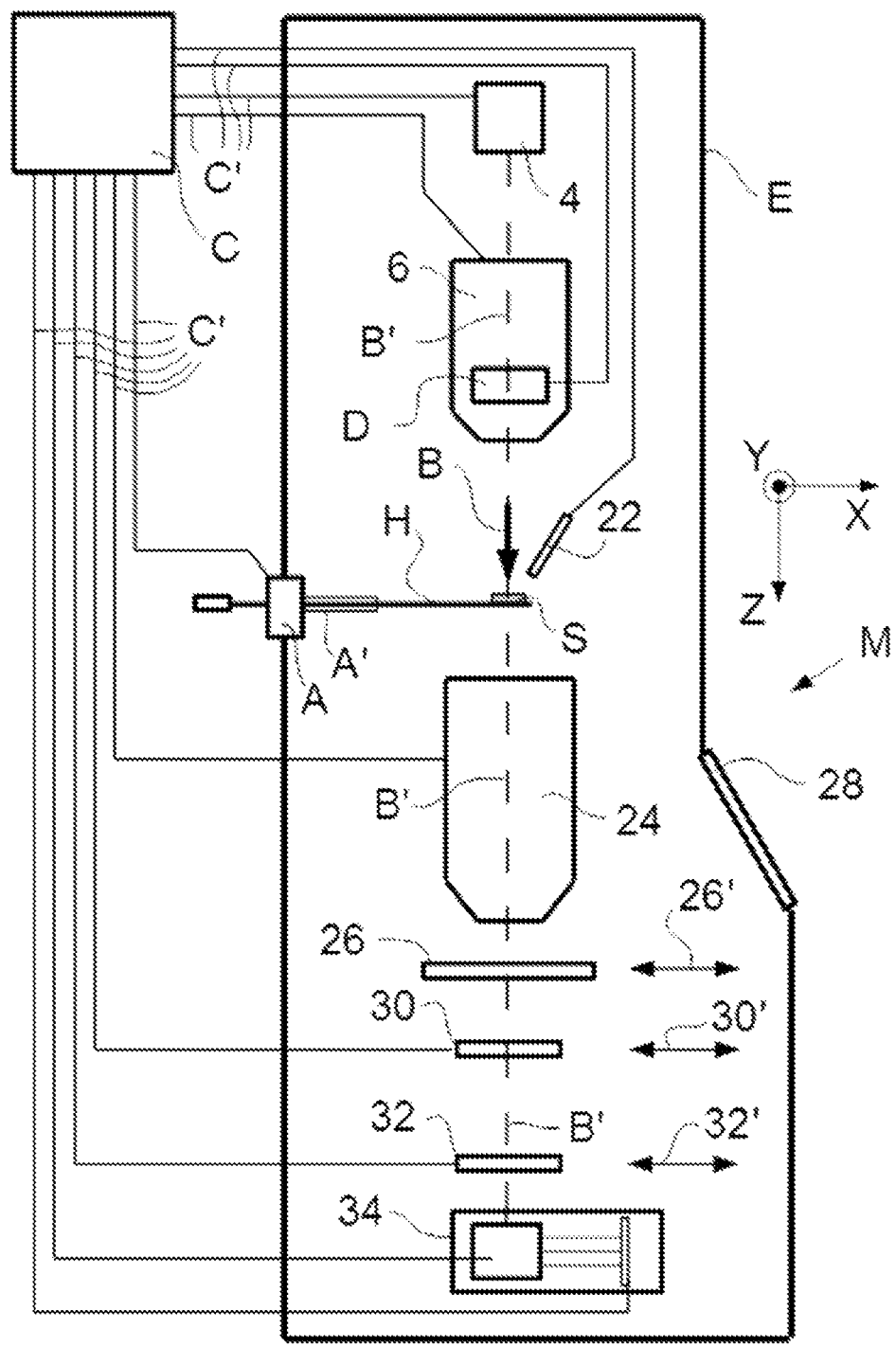

(51) Int. Cl.
*G01T 1/20* (2006.01)
*H01L 31/107* (2006.01)
*H04N 5/32* (2006.01)
*H01L 27/146* (2006.01)
*H01L 27/148* (2006.01)

(52) U.S. Cl.
CPC ............ *H01L 31/107* (2013.01); *H04N 5/32* (2013.01); *H01J 2237/057* (2013.01); *H01J 2237/24485* (2013.01); *H01J 2237/2802* (2013.01); *H01J 2237/2804* (2013.01); *H01L 27/148* (2013.01); *H01L 27/14643* (2013.01)

(58) Field of Classification Search
CPC .. H01J 37/04; H01J 37/06; H01J 37/09; H01J 37/145; H01J 37/147; H01J 37/222; H01J 37/226; H01J 37/252; H01J 3/261; H01J 37/265; H01J 37/29; H01J 37/295
USPC ................ 250/311, 307, 305, 306, 310, 309, 250/396 ML, 396 R, 397, 398, 494.1
See application file for complete search history.

(56) References Cited

U.S. PATENT DOCUMENTS

| | | | | |
|---|---|---|---|---|
| 6,794,648 | B2* | 9/2004 | Kaji ...................... | G01N 23/04 250/305 |
| 6,933,501 | B2* | 8/2005 | Kaji ...................... | G01N 23/04 250/305 |
| 7,642,513 | B2 | 1/2010 | Pinna et al. | |
| 8,247,769 | B2* | 8/2012 | Zewail ................... | H01J 37/22 250/306 |
| 8,334,512 | B2* | 12/2012 | Luecken ................ | H01J 37/05 250/305 |
| 8,440,970 | B2* | 5/2013 | Zewail ................... | H01J 37/22 250/306 |
| 8,901,493 | B2* | 12/2014 | Kaji ...................... | H01J 37/244 250/310 |
| 9,053,903 | B2* | 6/2015 | Zewail ................... | H01J 37/22 |
| 9,312,069 | B2* | 4/2016 | Lazic .................... | H01J 37/244 |
| 9,390,888 | B2* | 7/2016 | Wu ........................ | H01J 37/29 |
| 9,524,851 | B2* | 12/2016 | de Jong ................. | H01J 37/28 |
| 2002/0024058 | A1 | 2/2002 | Marshall et al. | |
| 2010/0108882 | A1* | 5/2010 | Zewail ................... | H01J 37/22 250/307 |
| 2012/0241611 | A1* | 9/2012 | Kaji ...................... | H01J 37/244 250/311 |
| 2016/0056015 | A1 | 2/2016 | Van Veen et al. | |
| 2016/0086762 | A1* | 3/2016 | de Jong ................. | H01J 37/05 250/305 |
| 2016/0276130 | A1* | 9/2016 | Mele ...................... | H04N 5/32 |
| 2016/0307729 | A1* | 10/2016 | Lazic .................... | H01J 37/222 |

FOREIGN PATENT DOCUMENTS

| | | |
|---|---|---|
| EP | 2487703 | 8/2012 |
| EP | 2487703 A1 | 8/2012 |
| EP | 2991112 | 2/2016 |

OTHER PUBLICATIONS

"Electron Microscope", Wikipedia, Accessed Oct. 15, 2015, 11 pages. <https://en.wikipedia.org/wiki/Electron_microscope>.
"Scanning Electron Microscope", Wikipedia, Accessed Oct. 15, 2015, 18 pages. <https://en.wikipedia.org/wiki/Scanning_electron_microscope>.
"Transmission Electron Microscopy", Wikipedia, Accessed Oct. 15, 2015, 23 pages. <https://en.wikipedia.org/wiki/Transmission_electron_microscopy>.
"Scanning Transmission Electron Microscopy", Wikipedia, Accessed Oct. 15, 2015, 5 pages. <https://en.wikipedia.org/wiki/Scanning_transmission_electron_microscopy>.
"Scanning Helium Ion Microscope", Wikipedia, Accessed Oct. 15, 2015, 2 pages. <https://en.wikipedia.org/wiki/Scanning_Helium_Ion_Microscope>.
W. H. Escovitz et al., "Scanning Transmission Ion Microscope with a Field Ion Source", Proc. Nat. Acad. Sci. USA, vol. 72, No. 5, pp. 1826-1828, May 1975, 3 pages.
"Electron Energy Loss Spectroscopy", Wikipedia, Accessed Mar. 17, 2016, 5 pages. <https://en.wikipedia.org/wiki/Electron_energy_loss_spectroscopy>.
"Energy Filtered Transmission Electron Microscopy", Wikipedia, Accessed Mar. 17, 2016, 2 pages. <https://en.wikipedia.org/wiki/Energy_filtered_transmission_electron_microscopy>.
K. Takada et al., "Logarithmic-Converting CCD Line Sensor and Its Noise Characteristics", Proc. 1997 IEEE Workshop on CCD & AIS, 5 pages.
M. Battaglia et al., "Back-thinning of CMOS Monolithic Active Pixel Sensors for the ILC at LBNL", SNIC Symposium, Apr. 3, 2006, 3 pages.
A. Tang et al., "A New 2.4GHz CMOS Low-Noise Amplifier with Automatic Gain Control", 49th IEEE International Midwest Symposium on Circuits and Systems, Aug. 6, 2006, 4 pages.
"Electron Energy Loss Spectroscopy", Wikipedia, Retrieved from the Internet Dec. 12, 2015, http://en.wikipedia.org/wiki/Electron_energy_loss_spectroscopy, 5 pages.
"Electron Microscope", Wikipedia, Retrieved from the Internet Oct. 15, 2015, http://en.wikipedia.org/wiki/Electron_microscope, 11 pages.
"Energy Filtered Transmission Electron Microscopy", Wikipedia, Retrieved from the internet Mar. 17, 2016, http://en.wikipedia.org/wiki/Energy_filtered_transmission_electron_microscopy, 2 pages.
"Scanning Electron Microscope", Wikipedia. Retrieved from the internet Aug. 4, 2016, http://en.wikipedia.org/wiki/Scanning_electron_microscope, 18 pages.
"Scanning Helium Ion Microscope", Wikipedia, Retrieved from the internet on Oct. 15, 2015, http://en.wikipedia.org/wiki/Scanning_Helium_Ion_Microscope, 2 pages.
"Scanning Transmission Electron Microscopy", Wikipedia, Retrieved from the internet Oct. 15, 2015, http://en.wikipedia.org/wiki/Scanning_transmission_electron_microscopy, 18 pages.
Transmission Electron Microscopy:, Wikipedia, Retrieved from the internet Oct. 15, 2015, http://en.wikipedia.org/wiki/Transmission_electron_microscopy, 23 pages.
Battaglia, M. et al., "Back-Thinning of CMOS Monolithic Active Pixel Sensors for the ILC at LBNL", SNIC Symposium, Retrieved from the internet Mar. 17, 2006, http://www.slac.stanford.edu/econf/C0604032/papers/0109.PDF, 3 pages.
Escovitz W.H. et al, Scanning Transmission Ion Microscope with a Field Ion Source, Retrieved from the internet Oct. 15, 2015; http://www.pnas.org/content/72/5/1826.full.pdf, 3 pages.
Takada, K. et al, "Logarithmic-Converting CCD Line Sensor and Its Noise Characteristics" Retrieved from the internet Mar. 3, 2016, http://www.imagesensors.org/Past%20Workshops/1997%20Workshop/1997%20Papers/18%20Takada%20and%20Miyatake.pdf, 4 pages.
Tang, A., et al. "A New 2.4GHz CMOS Low-Noise Amplifier with Automatic Gain Control" Retrieved from the internet Mar. 17, 2016, http://citeseerxist.psu.edu/viewdoc/download?doi=10.1.1.73.1068&rep=rep1&type=pdf, 4 pages.
Watt, F. et al., "Microscopy with Protons", Retrieved from the Internet Oct. 24, 2016, http://www.innovationmagazine.come/innovation/volumes/v7n1/coverstory3, 3 pages.

* cited by examiner

METHOD OF PERFORMING SPECTROSCOPY IN A TRANSMISSION CHARGED-PARTICLE MICROSCOPE

The invention relates to a Transmission Charged-Particle Microscope, comprising:
- A specimen holder, for holding a specimen;
- A source, for producing a beam of charged particles;
- An illuminator, for directing said beam so as to irradiate the specimen;
- An imaging system, for receiving a flux of charged particles transmitted through the specimen and directing it onto a spectroscopic apparatus comprising:
  - A dispersing device, for dispersing said flux into an energy-resolved array of spectral sub-beams distributed along a dispersion direction;
  - A detector.

The invention also relates to a method of performing spectroscopy in such a Transmission Charged-Particle Microscope.

The invention further relates to an Electron Energy-Loss Spectrometer (EELS) module comprising:
- A dispersing device, for dispersing an input flux of electrons into an energy-resolved array of spectral sub-beams distributed along a dispersion direction;
- A detector.

Charged-particle microscopy is a well-known and increasingly important technique for imaging microscopic objects, particularly in the form of electron microscopy. Historically, the basic genus of electron microscope has undergone evolution into a number of well-known apparatus species, such as the Transmission Electron Microscope (TEM), Scanning Electron Microscope (SEM), and Scanning Transmission Electron Microscope (STEM), and also into various sub-species, such as so-called "dual-beam" tools (e.g. a FIB-SEM), which additionally employ a "machining" Focused Ion Beam (FIB), allowing supportive activities such as ion-beam milling or Ion-Beam-Induced Deposition (IBID), for example. More specifically:
- In a SEM, irradiation of a specimen by a scanning electron beam precipitates emanation of "auxiliary" radiation from the specimen, in the form of secondary electrons, backscattered electrons, X-rays and photoluminescence (infrared, visible and/or ultraviolet photons), for example; one or more components of this emanating radiation is/are then detected and used for image accumulation purposes, and/or spectroscopic analysis (as in the case of EDX (Energy-Dispersive X-Ray Spectroscopy), for example).
- In a TEM, the electron beam used to irradiate the specimen is chosen to be of a high-enough energy to penetrate the specimen (which, to this end, will generally be thinner than in the case of a SEM specimen); the flux of transmitted electrons emanating from the specimen can then be used to create an image, or produce a spectrum (as in the case of EELS, for example). If such a TEM is operated in scanning mode (thus becoming a STEM), the image/spectrum in question will be accumulated during a scanning motion of the irradiating electron beam.

More information on some of the topics elucidated here can, for example, be gleaned from the following Wikipedia links:
http://en.wikipedia.org/wiki/Electron_microscope
http://en.wikipedia.org/wiki/Scanning_electron_microscope
http://en.wikipedia.org/wiki/Transmission_electron_microscopy
http://en.wikipedia.org/wiki/Scanning_transmission_electron_microscopy As an alternative to the use of electrons as irradiating beam, charged-particle microscopy can also be performed using other species of charged particle. In this respect, the phrase "charged particle" should be broadly interpreted as encompassing electrons, positive ions (e.g. Ga or He ions), negative ions, protons and positrons, for instance. As regards ion-based microscopy, some further information can, for example, be gleaned from sources such as the following:
http://en.wikipedia.org/wiki/Scanning_Helium_Ion_Microscope
W. H. Escovitz, T. R. Fox and R. Levi-Setti, *Scanning Transmission Ion Microscope with a Field Ion Source*, Proc. Nat. Acad. Sci. USA 72(5), pp 1826-1828 (1975).
http://www.innovationmagazine.com/innovation/volumes/v7n1/coverstory3.shtml It should be noted that, in addition to imaging and/or spectroscopy, a charged-particle microscope (CPM) may also have other functionalities, such as examining diffractograms, performing (localized) surface modification (e.g. milling, etching, deposition), etc.

In all cases, a Transmission Charged-Particle Microscope (TCPM) will comprise at least the following components:
- A radiation source, such as a Schottky electron source or ion gun.
- An illuminator, which serves to manipulate a "raw" radiation beam from the source and perform upon it certain operations such as focusing, aberration mitigation, cropping (with a stop/iris/condensing aperture), filtering, etc. It will generally comprise one or more charged-particle lenses, and may comprise other types of particle-optical component also. If desired, the illuminator can be provided with a deflector system that can be invoked to cause its output beam to perform a scanning motion across the specimen being investigated.
- A specimen holder, on which a specimen under investigation can be held and positioned (e.g. tilted, rotated). If desired, this holder can be moved so as to effect a scanning motion of the beam w.r.t. the specimen. In general, such a specimen holder will be connected to a positioning system such as a mechanical stage.
- An imaging system, which essentially takes charged particles that are transmitted through a specimen (plane) and directs (focuses) them onto analysis apparatus, such as a detection/imaging device, spectroscopic apparatus, etc. As with the illuminator referred to above, the imaging system may also perform other functions, such as aberration mitigation, cropping, filtering, etc., and it will generally comprise one or more charged-particle lenses and/or other types of particle-optical components.

When a spectroscopic apparatus as referred to here is present, it will generally comprise:
- A dispersing device (e.g. comprising one or more "charged-particle prisms"), to disperse an incoming flux of charged particles (from the imaging system) into an energy-resolved array of spectral sub-beams, which can ultimately be directed onto a detection surface so as to form a spectrum. Basically, said incoming flux will contain charged particles of various energies, and the dispersing device will "fan these out" (along a dispersion direction) into a collection (array) of individual sub-beams of given energies (in a manner somewhat reminiscent of a mass spectrometer).

A TCPM will also make use of:
A detector, which may be unitary or compound/distributed in nature, and which can take many different forms, depending on the radiation/entity being recorded. As indicated above, such a detector may, for example, be used to register an intensity value, to capture an image, or to record a spectrum. Examples include photomultipliers (including solid-state photomultipliers, SSPMs), photodiodes, (pixelated) CMOS detectors, (pixelated) CCD detectors, photovoltaic cells, etc., which may, for example, be used in conjunction with a scintillator film, for instance. For X-ray detection, use is typically made of a so-called Silicon Drift Detector (SDD), or a Silicon Lithium (Si(Li)) detector, for example. Typically, a TCPM will comprise several detectors, of various types.

In what follows, the invention may—by way of example—sometimes be set forth in the specific context of electron microscopy. However, such simplification is intended solely for clarity/illustrative purposes, and should not be interpreted as limiting.

An example of a TCPM as set forth above is a (S)TEM that is provided with an EELS module. Electron Energy-Loss Spectroscopy (EELS) is a technique used in (S)TEMs to obtain chemical information pertaining to a given specimen. A moving electron in an irradiating beam (from the (S)TEM's illuminator) can transfer energy to a bound electron in a core shell of an atom in the specimen, and promote this core electron to an outer shell (inelastic scattering). This energy-transfer from the moving electron gives rise to a so-called "core-loss peak" (CLP) in the EELS spectrum. The (coarse) position (in energy units) of the CLP is element-specific, and its precise position and shape are specific to the element's chemical environment and bonding. Typically, EELS modules can also be used as energy-selective imaging devices (EFTEMs: Energy-Filtered TEMs). To achieve this, they employ a slit ("letterbox") at/proximal their (primary) spectrum plane. When the module is used as a pure spectrometer, this slit is retracted, and the spectrum plane can be magnified and imaged onto the employed detector (camera) using post-dispersion optics. On the other hand, when the module is used as an energy-selective imaging device, the slit can be invoked to pass/admit only a specific energy window (typically of the order of 10-50 eV wide); in that case, the post-dispersion (post-slit) optics then image a Fourier Transform plane of said spectrum plane onto the detector. For more information on EELS and EFTEM, reference is made to the following links:

http://en.wikipedia.org/wiki/Electron_energy_loss_spectroscopy http://en.wikipedia.org/wiki/Energy_filtered_transmission_electron_microscopy Because of possible instabilities/fluctuations in the (high-tension) electrical power supplied to the illuminator, imaging system, source and/or EELS module, a precise measurement of the position of the CLP requires simultaneous or near-simultaneous recording of the CLP and the un-scattered component of the irradiating electron beam (the so-called "zero loss peak", ZLP). This is conventionally referred to as "tracking the ZLP", which inter alia acts as a metric for noise levels and an absolute energy scale reference for the CLP. Simultaneous recording of the ZLP and the CLP is typically not straightforward, inter alia because of the generally large intensity difference between the ZLP and the CLP (which can easily be of the order of 1000) and the generally large (energy) separation between the ZLP and the CLP (which can easily be of the order of 500 eV (electron volts), where 0.2 eV resolution is required/desired). Presently, near-simultaneous recording can be achieved using a so-called "Dual EELS" technique, e.g. as set forth in U.S. Pat. No. 7,642,513. In Dual EELS, two exposures are made in a single acquisition on the employed detector (e.g. a pixelated CCD camera), where one relatively short exposure (~1 µs, thus requiring an ultra-fast beam blanker/exposure shutter) is to record the ZLP, and a longer exposure (~10 ms) is to record the CLP (or, more generally, a set/spectrum of CLPs). In between these two exposures, ultra-fast deflectors are used to switch a different portion of the spectrum onto a different position on the detector. State-of-the-art Dual EELS equipment can, for example, record up to 1000 dual spectra per second.

In addition to the ZLP and CLPs referred to above, an EELS spectrum will generally also contain so-called "Plasmon Resonance Peaks" (PRPs), i.e. a relatively broad series of peaks/shoulders associated with single or multiple scattering of electrons on plasmons in the specimen. These PRPs occur between the ZLP and CLPs, and typically lie in the energy range 0-50 eV. Since a given incoming electron in the irradiating beam can (ultimately) undergo multiple scattering events, the CLP spectrum (inner-shell events) will typically be convoluted with/by the PRP spectrum (outer-shell events). Therefore, for a proper interpretation and quantification of the CLP spectrum, the PRP components must be measured and deconvoluted from the CLP components. For reasons similar to those set forth in the previous paragraph (i.e. large intensity difference and energy separation), the PRP spectral component generally cannot be recorded in a single exposure together with the ZLP and CLP components. Therefore, one must adopt a different approach, such as an augmented version of the Dual EELS approach set forth above, in which a triple rather than a dual exposure is made (one exposure each for the ZLP, PRP and CLP spectral segments).

As discussed above, the (standard or augmented) Dual EELS technique requires the use of ultra-fast deflectors and beam blankers, which are relatively expensive, bulky (in apparatus where available space is typically very confined) and prone to malfunction. Moreover, such a technique only allows near-simultaneous rather than truly simultaneous recording of the various spectral components and, in principle, fluctuations can still occur between component exposures, thereby causing an intrinsic uncertainty/error margin in results.

It is an object of the invention to address these issues. In particular, it is an object of the invention to provide a method that does not require the use of ultra-fast components, such as deflectors and beam-blankers. Moreover, it is an object of the invention that such a method should facilitate more accurate spectral analysis than the prior art, by allowing truly simultaneous rather than consecutive measurement of various spectral components.

These and other objects are achieved in a microscope as set forth in the opening paragraph above, which is characterized in that said detector comprises an assembly of sub-detectors arranged along said dispersion direction, whereby different sub-detectors are adjustable to have different detection sensitivities.

The inventive approach is inherently different to the prior art inter alia with regard to the following aspects:
By sub-dividing the detector into an assembly of component sub-detectors that are spatially distributed along the dispersion direction, the invention is capable of simultaneously capturing essentially the entire energy-resolved array of spectral sub-beams produced by the dispersing device and its associated post-dispersion optics. This, for example, means that—depending on the chosen magnification value of said post-dispersion optics—it becomes possible to simultaneously capture an entire EELS spectrum, comprising the ZLP, PRP(s) and CLP(s).

By embodying (at least some of) said sub-detectors to have adjustable detection sensitivities, they can be tailored to cope with the very substantial intensity differences typically present in a spectrum under investigation. More specifically, one can:

Reduce (relative to a given median/reference value) the sensitivity of sub-detectors that receive a relatively high intensity (e.g. from a (part of a) ZLP); and/or Increase (relative to said median value) the sensitivity of sub-detectors that receive a relatively low intensity (e.g. from a (part of a) CLP), thereby allowing a wide, intensity-diverse spectral region to be captured with a uniform capture time per sub-detector and yet without significant local over-exposure (saturation, clipping)/under-exposure (poor Signal-to-Noise Ratio, SNR). By (automatically) noting each sub-detector's employed sensitivity during a measurement (e.g. in a lookup table) and using this as a scaling factor, the total signal/spectrum accumulated by the array of sub-detectors can, if desired, be re-sized/converted back to its "raw" form (e.g. on a display device).

One can therefore use the invention to effectively address the longstanding issues (temporal drift, required dynamic range) set forth above. For example, the inventors have applied the invention to produce a detector with a dynamic range of four orders of magnitude, which can perform truly simultaneous/parallel detection of different sub-beams (in highly different energy regimes) without needing to resort to cumbersome means such as the ultra-fast switching devices (deflectors/blankers) of the Dual EELS approach.

In a particular embodiment of the present invention:
Said detector is pixelated;
Each of said sub-detectors comprises at least one pixel of the detector.

Although the invention certainly allows each sub-detector to be a discrete, self-contained, free-standing entity such as a (macroscopic) diode, using a pixelated detector has pronounced advantages, such as:

Allowing the detector to be more compact and/or to comprise a greater number of sub-detectors within a given available space;

Allowing the detector to be manufactured as an integrated (IC) device, with the various advantages attendant thereto (such as relatively low power consumption, short interconnections, fast response time, etc.).

Strictly speaking, it can suffice if the detector is pixelated along only said dispersion direction, thus forming a one-dimensional pixel array. However, it is also possible to use a two-dimensional pixel array, e.g. with lines of pixels extending both parallel (rows) and transverse (columns) to said dispersion direction. Such a configuration can, for example, be advantageous vis-à-vis an embodiment as described in the next paragraph.

In a further embodiment of the invention, each sub-detector is elongated along a transverse direction perpendicular to said dispersion direction. Using the Cartesian system introduced above, this means that each sub-detector extends in (at least) the Y direction. An advantage of such an arrangement is that it can cope with non-optimal alignment of the flux/array of spectral sub-beams in said transverse direction. Moreover, if there is intrinsically some radiation spread in this transverse direction, the current embodiment will allow more of that radiation to be captured by the detector, thus giving a better overall sensitivity/SNR. One way of achieving such elongation is to embody each sub-detector as a pixelated array extending along said transverse direction, whereby the transverse (column) pixels in a given sub-detector can (but don't necessarily have to) have a common detection sensitivity.

In a specific embodiment of the invention, said detector comprises a pixelated array of avalanche photodiodes having individually adjustable gain values. An avalanche photodiode is a reverse-biased diode with a relatively high built-in/intrinsic electric filed (typically >100 kV/cm). An electron-hole pair is generated within the diode's depletion region by incoming radiation, and these generated charge carriers are then accelerated by said electric field, whereby they can acquire enough energy to create a new electron-hole pair by impact ionization. These new carriers can then undergo the same process, thus giving rise to current multiplication (avalanche effect). The current gain G depends on diode properties such as:

VBR: breakdown voltage;
VR: reverse (bias) voltage across the diode;
n: impact ionization coefficient, according to a relationship of the following form:

$$G \sim \frac{1}{\left(1 - \left(\frac{VR}{VBR}\right)^n\right)}$$

By appropriately varying the reverse voltage VR, the gain value G can, for example, change from a few dozen to a few thousand. Operating above the breakdown voltage VBR can give even larger gains—suitable even for single electron detection—but, in this extreme regime (so-called Geiger mode), one runs the risk of generating (excessively) high currents, which might cause (permanent) damage to the photodiode. In practice, so-called "quenching circuits" can be used to help prevent such damage.

In another embodiment of the invention, said detector comprises a pixelated CMOS (Complementary Metal-Oxide Semiconductor) detector in which individual CMOS pixels have an adjustable parameter selected from the group comprising Conversion Gain, Full Well Capacity, and combinations hereof. Adjusting the Conversion Gain (CG) of a CMOS pixel will alter the size of the electric charge produced in the pixel by receipt of a given quantity of incoming (detection) energy; consequently, if the CG is, for example, lowered, then the pixel in question can be exposed to an increased quantity of energy before a certain (limiting) charge threshold is reached, and vice versa. On the other hand, adjustment of the Full Well Capacity (FWC) can be used to change the quantity of charge that can accumulate in the pixel before said threshold is reached; so, for example, if the FWC is increased, then the pixel in question can be exposed to an greater quantity of energy before a certain (limiting) charge threshold is reached, and vice versa. To give an analogy from mathematics:

Changing the CG is somewhat analogous to changing the slope of a straight line graph; whereas;
Changing the FWC is somewhat analogous to changing the (ordinate) offset of said graph.

The CG and FWC are typically inversely proportional. The sub-detector/pixel design limits the output voltage swing, and therefore a trade-off between CG and FWC typically needs to be found. Higher capacitance at the floating diffusion node tends to give a lower CG and a higher FWC. One possible way to increase the FWC and reduce the CG is to include an overflow capacitor in which excess charges generated in high-illumination conditions are integrated; in this way, both low- and high-illumination ranges can be made linear. Higher FWC can also be obtained using so-called logarithmic pixels and a time-dependent reset voltage: in such approaches, compression tends to cause non-linearity in the output signal.

In yet another embodiment of the invention, the detector comprises a pixelated CCD (Charge-Coupled Device) detector. In such a scenario, detection sensitivity can be adjusted in various ways. For example:
- One can use the device in "logarithmic mode", by connecting it to a logarithmic converter (e.g. a logarithmic MOSFET amplifier; MOSFET=Metal Oxide Semiconductor Field Effect Transistor). This is somewhat similar to CG adjustment in the case of a CMOS detector. For some general information on this approach, see, for example, the following article:
http://www.imagesensors.org/Past %20Workshops/ 1997%20Workshop/1997%20Papers/18%20 Takada%20and %20Miyatake.pdf
- One can employ a variable reset voltage, somewhat similar to what is done in a CMOS APS (Active Pixel Sensor). Here, the reset voltage is (temporally) adjusted in steps, as a function of the accumulated charge—corresponding somewhat to combined adjustment of CG and FWC in the case of a CMOS detector. A particular way to achieve such a variable reset voltage is to use so-called "Adaptive Sensitivity™", in which different pixels have different integration times based on charge level.

A detector as hereabove set forth can be used in a "naked" form, but it is also possible to use a more "composite" configuration. In this latter regard, in a particular embodiment of the invention, said detector comprises at least one of the following structures upstream of said assembly of sub-detectors:
- A radiation-hardening layer;
- A scintillation layer.

The term "upstream" as here employed should be interpreted as indicating that said structure(s) is/are located at the side of the detector facing the incoming flux of charged-particles (to be detected), including a possible configuration whereby the structure(s) is/are located right up against (e.g. integrated with) the rest of the assembly of sub-detectors (abutment/juxtaposition). More specifically:
- A radiation-hardening layer can help protect the detector from irradiation-induced damage, resulting from impingement of high-energy charged particles. Such particles can cause lattice defects at certain locations (layer interfaces) in the detector structure—with the attendant formation of dangling bonds or fixed charges in the dielectric—which can adversely influence the distribution of charge carriers in the device, with the occurrence of parasitic leakage currents or "dark currents" as a possible result. The atoms in a radiation-hardening layer can, for example, serve to neutralize/passivate (fill) these dangling bond sites or "shield" the fixed positive charges in the dielectric, thus tackling the root cause of these unwanted leakage currents. An example of a suitable radiation-hardening layer is a relatively thin Boron film, e.g. with a thickness of 1-2 nm or more. More information on radiation-hardening layers can, for example, be gleaned from European Patent Application EP 14182128 (FNL1412).
- A scintillation layer can, if desired, be used to convert an incoming charged particle into one or more photons, which are then detected by the (light-sensitive) detection surface(s) of the detector. One might, for example, wish to use a scintillation layer in situations where the total radiation dose is too high for common radiation-hardening techniques to deal with.

In another embodiment of the invention, the detector is back-thinned so as to mitigate electron backscattering within it. Such a back-thinning process essentially grinds/etches away a significant fraction of the (silicon) substrate on which the detector layers are deposited, thereby removing excess bulk and thus increasing the probability that an incoming detection particle will pass through and exit from the rear of the detector (e.g. into a beam dump) with a reduced probability of causing unwanted scattering events on its (shortened) path through the detector. An example of such a back-thinning procedure in a different context is set forth in the journal article by M. Battaglia et al., *Back-Thinning of CMOS Monolithic Active Pixel Sensors for the ILC at LBNL*, SNIC Symposium, Stanford, Calif., April 2006:
http://www.slac.stanford.edu/econf/C0604032/papers/ 0109.PDF As already set forth above, the crux of the current invention is to comprise the detector of sub-detectors having individually adjustable detection sensitivities. According to the invention, there are various ways in which said sensitivity adjustment can occur, e.g. on the basis of one or more of:
- (a) Calibration, whereby at least one test spectrum is analyzed so as to pre-determine charged-particle intensities in said first and second regions;
- (b) Modeling, whereby mathematical calculation is used to predict charged-particle intensities in said first and second regions;
- (c) Autonomous adjustment, whereby a given sub-detector can self-adjust its sensitivity in response to a received charged-particle intensity.

As a general note applicable to the present invention as a whole, but particularly to the current embodiment, it should be noted that (re-)adjustment of the detection sensitivities of various sub-detectors may, for example, be necessary/desirable as a result of one or more of the following occurrences:
- Changing the specimen, or the region of the specimen, from which a spectrum is being accumulated;
- Adjusting a magnification value of the post-dispersion optics located between the dispersing device and the detector, and/or adjusting a setting of the dispersing device. The result of such adjustment will be to cause the spectrum to expand/contract in the dispersion direction, thereby (potentially) changing the portion of the spectrum that falls on the detector.
- Adjusting a deflection value of a charged-particle deflecting device (e.g. drift tube/set of deflector plates) located upstream of the detector. The result of such adjustment will be to cause the spectrum to shift/offset in the dispersion direction, thereby (potentially) changing the portion of the spectrum that falls on the detector.
- Changes to/fluctuations in the power supplied to the source, illuminator, imaging system, etc., which will tend to increase/decrease the overall intensity of the spectrum without causing relative intensity-changes within the spectrum.

Possibilities (a)-(c) above will now be explained in more detail.

In (a), one or more test spectra (from a particular (type) of specimen, and at particular device settings) are accumulated and examined, so as to decide what parts (dispersion angles) have a relatively high intensity and what parts have a relatively low intensity. This information is then used to set the detection sensitivities of the various sub-detectors for acquisition of subsequent non-test spectra.

In (b), a physical/mathematical model is used to predict the intensity profile of the (portion of the) spectrum that will fall upon the detector. Such a model may, for example, use scaling and/or interpolation/extrapolation to decide how an initial spectrum (as "seen" by the detector) will change in response to occurrences such as those set forth above). It might also/alternatively calculate an expected spectrum ab initio from certain input information regarding specimen material(s) and tool settings, for example.

In (c), a given sub-detector can self-adjust in response to the (increasing) radiation dose to which it is being subjected during a given measurement session (acquisition time). One way to achieve this is, for example, to have a one or more reserve charge capacitors standing by as an overflow reservoir in the event that a main/primary capacitor fills up beyond a critical point; by (automatically) invoking this overflow reservoir, the sub-detector can continue to accrue charge in a controlled manner without saturating. Another way to achieve this is to make use of a circuit that can intelligently adjust the gain of the sub-detector on-the-fly, e.g. using a control loop. An example of such an automatic gain adjustment approach in a different context is set forth in the following internet link:
http://citeseerx.ist.psu.edu/viewdoc/
download?doi=10.1.1.73.1068&rep=rep1&type=pdf It should be explicitly noted that any of approaches (a), (b) and (c) can, according to need/desire, be used individually or jointly. It should also be noted that, if desired, previously obtained results in cases (a) and/or (b) could, if desired, be stored in a lookup table for future rapid reference, thus further streamlining the process of sensitivity adjustment/tuning of the various sub-detectors.

As explained above, the current invention essentially allows individual sub-detector detection sensitivity to be:
Relatively low in a first region of said array in which there is a relatively high charged-particle intensity;
Relatively high in a second region of said array in which there is a relatively low charged-particle intensity,
where, for good order, it is noted that the concepts of "relatively high" and "relatively low" can be interpreted relative to one another rather than needing to be referenced to a given absolute scale, for example. In a useful associated aspect of the invention, a first detection result from said first region and a second detection result from said second region can be used to perform at least one or more actions selected from the following group:
(i) Deconvolving said second detection result using said first and second detection results as input to a mathematical deconvolution procedure;
(ii) Correcting for a contribution of an instrument-related transfer function in said second detection result;
(iii) Determining an absolute energy scale for said second detection result;
(iv) Determining an absolute intensity scale for said second detection result;
(v) Deducing a thickness of the specimen from a comparison of an integrated intensity of said first and second detection results;
(vi) Using said first detection result as input to a feedback loop to adjust an output of a power supply connected to at least one of said source, illuminator, imaging system and dispersing device.

These actions can be elucidated in more detail as follows, whereby specific (illustrative) reference is made to an EELS spectrum. It should be noted that, before use, the first and/or second detection results may first be scaled/restored on the basis of the employed sensitivity settings of the sub-detectors used to obtain them.

(I) As already indicated above, the CLP and PRP spectral components are convoluted, because a given electron entering the EELS module can, in general, have caused a mixture of (inner-shell) CLP and (outer-shell) PRP "events" in the specimen under investigation. If the CLP and PRP components are separately measured, they can be deconvolved ("disentangled") using known mathematical procedures based, for example, on Bayesian, Fourier Log or Fourier Ratio techniques. The skilled artisan in the field of spectral analysis will be familiar with such mathematical techniques, but, for more information, reference is made to the book (Chapter 4, in particular) by Ray Egerton, "Electron Energy-Loss Spectroscopy in the Electron Microscope", third edition, 2011, ISBN 978-1-4419-9583-4, Springer Science & Business Media (pub.).

(II) The detector output will typically be distorted/deformed as a result of various instrument-related effects, such as dark signals, response time effects, hysteresis, artifacts, noise, etc. Such effects can also be deconvoluted out of the second detection result with the aid of the first detection result, e.g. in a manner as elucidated in (I) above.

(III) The ZLP can act as an absolute energy reference for the PRP/CLP parts of a spectrum, because the energy of electrons in the incoming flux is known (on the basis of the employed (resultant) acceleration potential) and the ZLP portion of the spectrum effectively "preserves" this energy. By comparing the peak positions in the CLP/PRP component to the ZLP peak position, an absolute (rather than relative) energy scale can be associated with them.

(IV) In a related way to that in which the position (abscissa) of a CLP/PRP peak can be calibrated (rendered absolute) by comparison to the position of the ZLP peak, it is also possible to calibrate/normalize the peak height (intensity) using the current invention—whereby the ZLP peak height is used as a calibration reference for peak heights in the CLP/PRP spectral portion. In so doing, one can make allowances for such effects as intensity variations in the incoming charged-particle flux, thickness-variations in the specimen, etc.

(V) A comparison of an integrated intensity of the (ZLP+PRP) components relative to an integrated intensity of the PRP component can allow one to deduce the thickness of the specimen under investigation (see, for example, the abovementioned book by Egerton).

(VI) The first detection result can be used as input to a feedback loop to adjust an output of a power supply connected to at least one of said source, illuminator, imaging system and dispersing device. As discussed above, instabilities/fluctuations in the (high-tension) electrical power supplied to such modules can manifest themselves in fluctuations in the ZLP (energy) position.

Tracking of this position (via the first detection result) can thus allow feedback stabilization of the supplied power.

The invention will now be elucidated in more detail on the basis of exemplary embodiments and the accompanying schematic drawings, in which:

FIG. 1 renders a longitudinal cross-sectional view of a charged-particle microscope in which an embodiment of the current invention is enacted.

Figure 2:
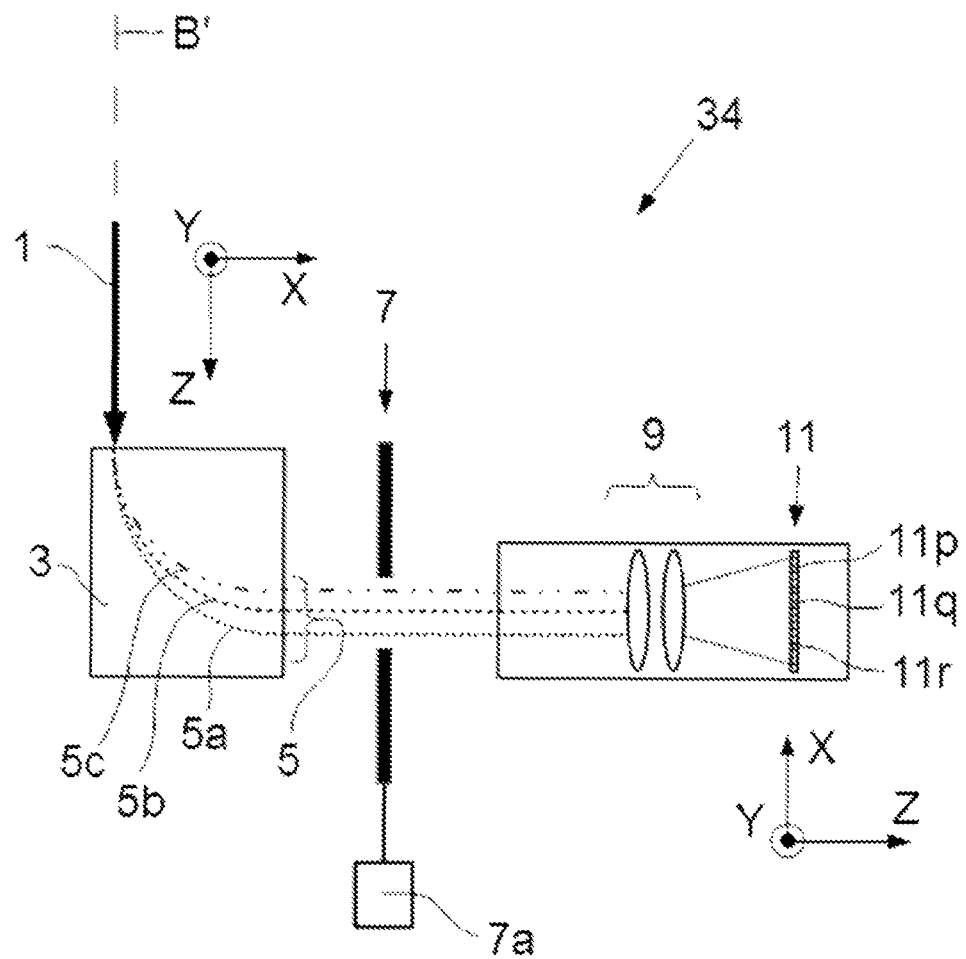

FIG. 2 renders an enlarged longitudinal cross-sectional view of part of the subject of FIG. 1, namely a spectroscopic apparatus in which an embodiment of the present invention is enacted.

Figure 3:
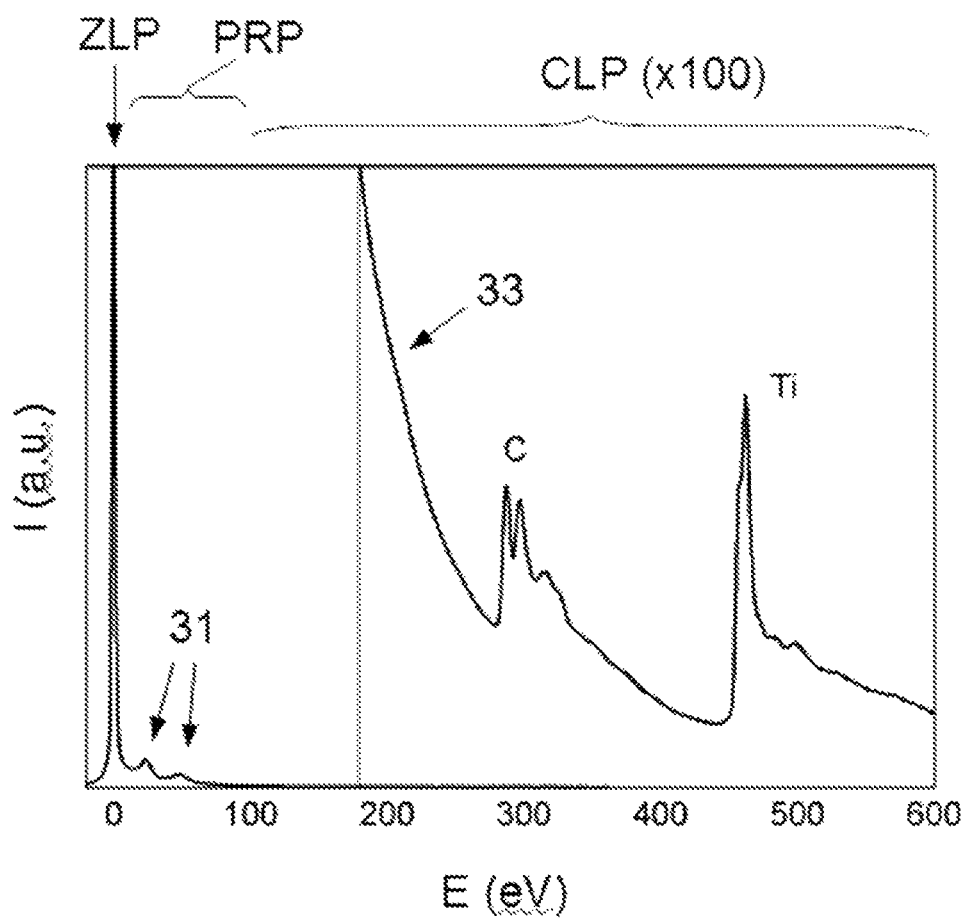

FIG. 3 shows an example of an EELS spectrum.

In the Figures, where pertinent, corresponding parts are indicated using corresponding reference symbols. It should be noted that, in general, the Figures are not to scale.

EMBODIMENT 1

FIG. 1 is a highly schematic depiction of an embodiment of a TCPM M according to the current invention, which, in this case, is a TEM/STEM (though, in the context of the current invention, it could just as validly be an ion-based or proton microscope, for example). In the Figure, within a vacuum enclosure E, an electron source 4 (such as a Schottky emitter, for example) produces a beam (B) of electrons that traverse an electron-optical illuminator 6, serving to direct/focus them onto a chosen part of a specimen S (which may, for example, be (locally) thinned/planarized). This illuminator 6 has an electron-optical axis B', and will generally comprise a variety of electrostatic/magnetic lenses, (scan) deflector(s) D, correctors (such as stigmators), etc.; typically, it can also comprise a condenser system (the whole of item 6 is sometimes referred to as "a condenser system").

The specimen S is held on a specimen holder H. As here illustrated, part of this holder H (inside enclosure E) is mounted in a cradle A' that can be positioned/moved in multiple degrees of freedom by a positioning device (stage) A; for example, the cradle A' may (inter alia) be displaceable in the X, Y and Z directions (see the depicted Cartesian coordinate system), and may be rotated about a longitudinal axis parallel to X. Such movement allows different parts of the specimen S to be irradiated/imaged/inspected by the electron beam traveling along axis B' (and/or allows scanning motion to be performed as an alternative to beam scanning [using deflector(s) D], and/or allows selected parts of the specimen S to be machined by a (non-depicted) focused ion beam, for example).

The (focused) electron beam B traveling along axis B' will interact with the specimen S in such a manner as to cause various types of "stimulated" radiation to emanate from the specimen S, including (for example) secondary electrons, backscattered electrons, X-rays and optical radiation (cathodoluminescence). If desired, one or more of these radiation types can be detected with the aid of detector 22, which might be a combined scintillator/photomultiplier or EDX (Energy-Dispersive X-Ray Spectroscopy) module, for instance; in such a case, an image could be constructed using basically the same principle as in a SEM. However, alternatively or supplementally, one can study electrons that traverse (pass through) the specimen S, emerge (emanate) from it and continue to propagate (substantially, though generally with some deflection/scattering) along axis B'. Such a transmitted electron flux enters an imaging system (combined objective/projection lens) 24, which will generally comprise a variety of electrostatic/magnetic lenses, deflectors, correctors (such as stigmators), etc. In normal (non-scanning) TEM mode, this imaging system 24 can focus the transmitted electron flux onto a fluorescent screen 26, which, if desired, can be retracted/withdrawn (as schematically indicated by arrows 26') so as to get it out of the way of axis B'. An image (or diffractogram) of (part of) the specimen S will be formed by imaging system 24 on screen 26, and this may be viewed through viewing port 28 located in a suitable part of a wall of enclosure E. The retraction mechanism for screen 26 may, for example, be mechanical and/or electrical in nature, and is not depicted here.

As an alternative to viewing an image on screen 26, one can instead make use of the fact that the depth of focus of the electron flux emerging from imaging system 24 is generally quite large (e.g. of the order of 1 meter). Consequently, various types of sensing device/analysis apparatus can be used downstream of screen 26, such as:

TEM camera 30. At camera 30, the electron flux can form a static image (or diffractogram) that can be processed by controller C and displayed on a display device (not depicted), such as a flat panel display, for example. When not required, camera 30 can be retracted/withdrawn (as schematically indicated by arrows 30') so as to get it out of the way of axis B'.

STEM recorder 32. An output from recorder 32 can be recorded as a function of (X,Y) scanning position of the beam B on the specimen S, and an image can be constructed that is a "map" of output from recorder 32 as a function of X,Y. Recorder 32 can comprise a single pixel with a diameter of e.g. 20 mm, as opposed to the matrix of pixels characteristically present in camera 30. Moreover, recorder 32 will generally have a much higher acquisition rate (e.g. $10^6$ points per second) than camera 30 (e.g. $10^2$ images per second). Once again, when not required, recorder 32 can be retracted/withdrawn (as schematically indicated by arrows 32') so as to get it out of the way of axis B' (although such retraction would not be a necessity in the case of a donut-shaped annular dark field recorder 32, for example; in such a recorder, a central hole would allow beam passage when the recorder was not in use).

As an alternative to imaging using camera 30 or recorder 32, one can also invoke spectroscopic apparatus 34, which could be an EELS module, for example.

It should be noted that the order/location of items 30, 32 and 34 is not strict, and many possible variations are conceivable. For example, spectroscopic apparatus 34 can also be integrated into the imaging system 24.

Note that the controller (computer processor) C is connected to various illustrated components via control lines (buses) C'. This controller C can provide a variety of functions, such as synchronizing actions, providing setpoints, processing signals, performing calculations, and displaying messages/information on a display device (not depicted). Needless to say, the (schematically depicted) controller C may be (partially) inside or outside the enclosure E, and may have a unitary or composite structure, as desired. The skilled artisan will understand that the interior of the enclosure E does not have to be kept at a strict vacuum; for example, in a so-called "Environmental TEM/STEM", a background atmosphere of a given gas is deliberately introduced/maintained within the enclosure E. The skilled artisan will also understand that, in practice, it may be advantageous to confine the volume of enclosure E so that, where possible, it essentially hugs the axis B', taking the form of a small tube (e.g. of the order of 1 cm in diameter) through which the employed electron beam passes, but widening out to accommodate structures such as the source 4, specimen holder H, screen 26, camera 30, recorder 32, spectroscopic apparatus 34, etc.

Turning now to FIG. 2, this shows an enlarged and more detailed view of the spectroscopic apparatus 34 in FIG. 1. In the Figure, a flux 1 of electrons (which has passed through specimen S and imaging system 24) is shown propagating along electron-optical axis B'. This flux 1 enters a dispersing device 3 ("electron prism"), where it is dispersed (fanned out) into an energy-resolved (energy-differentiated) array 5 of spectral sub-beams (schematically indicated in FIG. 2 using broken lines), which are distributed along dispersion direction X; for illustration purposes, three of these sub-beams are labelled 5a, 5b and 5c in the Figure. Note in this regard that, conventionally, propagation is considered to occur along the Z direction, and the depicted Cartesian coordinate system thus "co-deflects with" the flux 1 within the dispersing device 3.

Downstream of item 3, the array 5 of sub-beams encounters an adjustable/retractable slit (letterbox) 7, which can, for example, be used in EFTEM-mode to select/admit a given portion of the array 5 and to discard/occlude other portions thereof; to this end, the slit 7 is connected to an actuation device 7a that can be invoked to open/close/move the (opening in the) slit 7 as desired. In EELS mode, this slit 7 is usually (fully) open/retracted. The skilled artisan will understand that the slit 7 is advantageously disposed at a location at or proximal to a dispersion plane of the spectroscopic apparatus 34; similarly, the detector 11 is also advantageously located at or proximal to such a plane. If required, it is possible to aim/shift the array 5 of spectral sub-beams falling upon the slit 7 by appropriately adjusting, for example, (an electrical signal to) the dispersing device 3 and/or a drift tube/deflector (not depicted) provided between the dispersing device 3 and slit 7, for instance.

After having traversed slit 7, the (selected portion of the) array 5 passes through post-dispersion electron optics 9, where it is magnified/focused, for example, and ultimately directed/projected onto detector 11. In accordance with the current invention, detector 11 comprises an assembly of sub-detectors arranged along dispersion direction X, with different sub-detectors being adjustable so as to have different detection sensitivities; for illustration purposes, three of these sub-detectors are labelled 11p, 11q and 11r in the Figure. Each of these sub-detectors (e.g. 11p, 11q, 11r) may, for example, be:

An avalanche photodiode, or a linear array of such avalanche photodiodes extending along Y;

A pixel (e.g. a 3T pixel) of a CMOS or CCD sensor, or a linear array of such pixels extending along Y.

The sensitivity of a given sub-detector (e.g. 11p, 11q, 11r) can be matched to suit the intensity of the portion of the array 5 that impinges upon it.

In a specific (non-limiting), illustrative example of an EELS spectrum (see also FIG. 3):

Sub-beam 5a comprises (part of) a ZLP spectral component, and impinges upon sub-detector 11r, which is adjusted to have a relatively low detection sensitivity;

Sub-beam 5b comprises (part of) a PRP spectral component, and impinges upon sub-detector 11q, which is adjusted to have an intermediate-value detection sensitivity;

Sub-beam 5c comprises (part of) a CLP spectral component, and impinges upon sub-detector 11p, which is adjusted to have a relatively high detection sensitivity.

EMBODIMENT 2

FIG. 3 shows an example of an EELS spectrum. The Figure renders intensity I (in arbitrary units, a.u.) as a function of energy-loss E (in eV) for electrons that have traversed a specimen containing Carbon and Titanium. From left to right, the main features of the spectrum are:

A Zero-Loss Peak ZLP, representing electrons that traverse the specimen without undergoing inelastic scattering therein.

A Plasmon Resonance Peak component/section PRP (sometimes referred to as a Valence Loss component). This typically extends from about 0 to 50 eV, although there is no strict definition of its upper limit. It is characterized by peaks/shoulders resulting from outer-shell scattering events in the specimen, such as peaks 31. Note that the PRP component usually has a significantly lower intensity than the ZLP.

A Core Loss Peak component/section CLP. This typically starts at about 50 eV (after the PRP component), although there is no strict definition of its lower limit. It is typically of such a low intensity relative to the ZLP/PRP components that, as rendered in FIG. 3, it is enlarged by a multiplication factor (e.g. 100) to improve visibility of its details. As can be seen, it contains (clusters of) peaks/shoulders that can be associated with certain chemical elements (such as C and Ti, in the current example), seated on top of a substantial background contribution 33.

The invention claimed is:

1. A Transmission Charged-Particle Microscope, comprising:
   a specimen holder, for holding a specimen;
   a source, for producing a beam of charged particles;
   an illuminator, for directing said beam so as to irradiate the specimen;
   an imaging system, for receiving a flux of charged particles transmitted through the specimen and directing it onto a spectroscopic apparatus comprising:
      a dispersing device, for dispersing said flux into an energy-resolved array of spectral sub-beams distributed along a dispersion direction; and
      a detector
including an assembly of sub-detectors arranged along said dispersion direction, whereby different sub-detectors are adjustable to have different detection sensitivities.

2. A microscope according to claim 1, wherein:
   said detector is pixelated;
   each of said sub-detectors comprises at least one pixel of the detector.

3. A microscope according to claim 1, wherein each sub-detector is elongated along a transverse direction perpendicular to said dispersion direction.

4. A microscope according to claim 2, wherein said detector comprises a pixelated array of avalanche photodiodes having individually adjustable gain values.

5. A microscope according to claim 2, wherein said detector comprises a pixelated CMOS detector in which individual CMOS pixels have an adjustable parameter selected from the group comprising Conversion Gain, Full Well Capacity, and combinations hereof.

6. A microscope according to claim 2, wherein said detector comprises a pixelated CCD detector.

7. A microscope according to claim 1, wherein said detector comprises at least one of the following structures upstream of said assembly of sub-detectors:
   a radiation-hardening layer;
   a scintillation layer.

8. A microscope according to claim 1, wherein said detector is back-thinned so as to mitigate electron backscattering within the detector.

9. A method of performing spectroscopy in a Transmission Charged-Particle Microscope, the method comprising:
providing a specimen on a specimen holder;
producing a beam of charged particles from a source;
using an illuminator to direct said beam so as to irradiate the specimen;
using an imaging system to receive a flux of charged particles transmitted through the specimen and direct it onto a spectroscopic apparatus comprising:
a dispersing device, for dispersing said flux into an energy-resolved array of spectral sub-beams distributed along a dispersion direction;
a detector
including an assembly of sub-detectors arranged along said dispersion direction, whereby different sub-detectors are adjustable to have different detection sensitivities;
adjusting said sensitivities to be:
relatively low in a first region of said array in which there is a relatively high charged-particle intensity;
relatively high in a second region of said array in which there is a relatively low charged-particle intensity; and
using said detector to perform simultaneous detection of said first and second regions.

10. A method according to claim 9, wherein:
said first region comprises at least part of a feature selected from the group comprising an EELS Zero Loss Peak and an EELS Plasmon Resonance Peak;
said second region comprises at least part of an EELS Core Loss Peak.

11. A method according to claim 9, wherein said adjusting of sensitivity occurs using at least one method selected from the group comprising:
calibration, whereby at least one test spectrum is analyzed so as to pre-determine charged-particle intensities in said first and second regions;
modeling, whereby mathematical calculation is used to predict charged-particle intensities in said first and second regions;
autonomous adjustment, whereby a given sub-detector can self-adjust its sensitivity in response to a received charged-particle intensity,
and combinations hereof.

12. A method according to claim 9, wherein a first detection result from said first region and a second detection result from said second region are used to perform at least one action selected from the following group:
deconvolving said second detection result using said first and second detection results as input to a mathematical deconvolution procedure;
correcting for a contribution of an instrument-related transfer function in said second detection result;
determining an absolute energy scale for said second detection result;
determining an absolute intensity scale for said second detection result;
deducing a thickness of the specimen from a comparison of an integrated intensity of said first and second detection results;
using said first detection result as input to a feedback loop to adjust an output of a power supply connected to at least one of said source, illuminator, imaging system and dispersing device,
and combinations hereof.

13. An Electron Energy-Loss Spectrometer module comprising:
a dispersing device, for dispersing an input flux of electrons into an energy-resolved array of spectral sub-beams distributed along a dispersion direction; and
a detector
including an assembly of sub-detectors arranged along said dispersion direction, whereby different sub-detectors are adjustable to have different detection sensitivities.

14. The electron energy-loss spectrometer module of claim 13, wherein said detector comprises a pixelated array of avalanche photodiodes having individually adjustable gain values.

15. The electron energy-loss spectrometer module of claim 13, wherein said detector comprises a pixelated CMOS detector in which individual CMOS pixels have an adjustable parameter selected from the group comprising Conversion Gain, Full Well Capacity, and combinations hereof.

16. The electron energy-loss spectrometer module of claim 13, wherein said detector comprises a pixelated CCD detector.

17. A microscope according to claim 2, wherein each sub-detector is elongated along a transverse direction perpendicular to said dispersion direction.

18. A method according to claim 10, wherein said adjusting of sensitivity occurs using at least one method selected from the group comprising:
calibration, whereby at least one test spectrum is analyzed so as to pre-determine charged-particle intensities in said first and second regions;
modeling, whereby mathematical calculation is used to predict charged-particle intensities in said first and second regions;
autonomous adjustment, whereby a given sub-detector can self-adjust its sensitivity in response to a received charged-particle intensity,
and combinations hereof.

19. A method according to claim 10, wherein a first detection result from said first region and a second detection result from said second region are used to perform at least one action selected from the following group:
deconvolving said second detection result using said first and second detection results as input to a mathematical deconvolution procedure;
correcting for a contribution of an instrument-related transfer function in said second detection result;
determining an absolute energy scale for said second detection result;
determining an absolute intensity scale for said second detection result;
deducing a thickness of the specimen from a comparison of an integrated intensity of said first and second detection results;
using said first detection result as input to a feedback loop to adjust an output of a power supply connected to at least one of said source, illuminator, imaging system and dispersing device,
and combinations hereof.

20. A method according to claim 11, wherein a first detection result from said first region and a second detection result from said second region are used to perform at least one action selected from the following group:
deconvolving said second detection result using said first and second detection results as input to a mathematical deconvolution procedure;
correcting for a contribution of an instrument-related transfer function in said second detection result;

determining an absolute energy scale for said second detection result;
determining an absolute intensity scale for said second detection result;
deducing a thickness of the specimen from a comparison of an integrated intensity of said first and second detection results;
using said first detection result as input to a feedback loop to adjust an output of a power supply connected to at least one of said source, illuminator, imaging system and dispersing device,
and combinations hereof.

* * * * *